United States Patent
Daubenspeck et al.

(10) Patent No.: US 9,331,037 B2
(45) Date of Patent: May 3, 2016

(54) PREVENTING MISSHAPED SOLDER BALLS

(71) Applicant: GLOBALFOUNDRIES Inc., Grand Cayman (KY)

(72) Inventors: Timothy H. Daubenspeck, Colchester, VT (US); Jeffrey P. Gambino, Portland, OR (US); Christopher D. Muzzy, Burlington, VT (US); Wolfgang Sauter, Burke, VT (US); Timothy D. Sullivan, Underhill, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/886,177

(22) Filed: Oct. 19, 2015

(65) Prior Publication Data

US 2016/0043048 A1     Feb. 11, 2016

Related U.S. Application Data

(62) Division of application No. 13/966,656, filed on Aug. 14, 2013, now abandoned.

(51) Int. Cl.
*H01L 21/44* (2006.01)
*H01L 21/4763* (2006.01)
(Continued)

(52) U.S. Cl.
CPC ............. *H01L 24/11* (2013.01); *H01L 23/3192* (2013.01); *H01L 24/03* (2013.01);
(Continued)

(58) Field of Classification Search
CPC .......... H01L 2924/00014; H01L 2924/00012; H01L 2924/014; H01L 2224/034; H01L 2224/05027; H01L 2224/05556; H01L 2224/05572; H01L 2224/11011; H01L 2224/11849; H01L 2224/131; H01L 2224/03845; H01L 2224/03912; H01L 2224/0401; H01L 2224/05022; H01L 2224/05558; H01L 2224/05573; H01L 2224/1134; H01L 2224/11472; H01L 2224/13027; H01L 23/3192; H01L 24/03; H01L 24/05; H01L 24/11; H01L 24/13
USPC .......... 438/612, 613, 614, 632, 646; 257/738, 257/780, E23.021, E23.023, E21.509
See application file for complete search history.

(56) References Cited

U.S. PATENT DOCUMENTS 6,130,141 A    10/2000   Degani et al.
8,575,493 B1   11/2013   Xu et al.
(Continued)

FOREIGN PATENT DOCUMENTS

JP    2000311962 A    11/2000
WO    2010131388 A1   11/2010

OTHER PUBLICATIONS

"Chemical-mechanical Planarization", Wikipedia, the free encyclopedia, This page last modified on Jan. 1, 2015 at 22:40,<http://en.wikipedia.org/wiki/Chemical-mechanical_planarization>, 4 pages.
(Continued)

*Primary Examiner* — Teresa M Arroyo
(74) *Attorney, Agent, or Firm* — David Cain; Hoffman Warnick LLC (57) ABSTRACT

"Thick line dies" that, during manufacture, avoid locating an upstanding edge of a photoresist layer (for example, the edge of a dry film photoresist layer) on top of a "discontinuity." In this way solder does not flow into the mechanical interface between the photoresist layer and the layer under the photoresist layer in the vicinity of an upstanding edge of the photoresist layer.

11 Claims, 5 Drawing Sheets

(51) Int. Cl.
*H01L 23/48* (2006.01)
*H01L 23/52* (2006.01)
*H01L 29/40* (2006.01)
*H01L 23/00* (2006.01)
*H01L 23/31* (2006.01)

(52) U.S. Cl.
CPC ............... *H01L 24/05* (2013.01); *H01L 24/13* (2013.01); *H01L 2224/034* (2013.01); *H01L 2224/03845* (2013.01); *H01L 2224/03912* (2013.01); *H01L 2224/0401* (2013.01); *H01L 2224/05022* (2013.01); *H01L 2224/05027* (2013.01); *H01L 2224/05558* (2013.01); *H01L 2224/05572* (2013.01); *H01L 2224/05573* (2013.01); *H01L 2224/11011* (2013.01); *H01L 2224/1162* (2013.01); *H01L 2224/1182* (2013.01); *H01L 2224/11472* (2013.01); *H01L 2224/11616* (2013.01); *H01L 2224/11849* (2013.01); *H01L 2224/131* (2013.01); *H01L 2224/13027* (2013.01); *H01L 2924/00012* (2013.01); *H01L 2924/00014* (2013.01); *H01L 2924/014* (2013.01); *H01L 2924/2064* (2013.01)

(56) References Cited

U.S. PATENT DOCUMENTS

| | | |
|---|---|---|
| 2003/0073036 A1 | 4/2003 | Peng et al. |
| 2012/0119362 A1 | 5/2012 | Daubenspeck et al. |
| 2012/0256313 A1 | 10/2012 | Guerin et al. |
| 2013/0207239 A1 | 8/2013 | Yu et al. |
| 2014/0264843 A1 | 9/2014 | Lin et al. |

OTHER PUBLICATIONS

Arroyo, Non-final Office Action, Dated Jan. 21, 2015, U.S. Appl. No. 13/966,656, 11 Pages.

Arroyo, Final Office Action, Dated Jun. 10, 2015, U.S. Appl. No. 13/966,656, 11 Pages.

Arroyo, Advisory Action, Dated Sep. 10, 2015, U.S. Appl. No. 13/966,656, 7 Pages.

PREVENTING MISSHAPED SOLDER BALLS

FIELD OF THE INVENTION

The present invention relates generally to the field of semiconductor dies, and more particularly to flip chip interconnections.

BACKGROUND OF THE INVENTION

The need to incorporate inductors and resistors in high frequency semiconductor devices has increased the phenomenon of wafer non-planarity. Increasingly thicker metal lines (as measured perpendicular to the plane of the chip surface) are needed as the last wiring levels on the semiconductor devices to provide sufficient cross-sectional area of the lines such that they meet inductance and current carrying requirements. This increased thickness leads to an increased size of out of plane conditions, which out of plane conditions are sometimes referred to herein as topography.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

SUMMARY

A method is presented for making a semiconductor die contact assembly including: providing a first stage assembly, removing a photoresist layer from the first stage assembly to yield a second stage assembly, and removing a portion of a ball limiting metallurgy layer from the second stage assembly to yield a third stage assembly. The first stage assembly includes the ball limiting metallurgy layer, a first thick pad, the photoresist layer, and a first pre-reflow solder structure. In the first and second stage assemblies, the ball limiting metallurgy layer defines a top surface. In the first stage assembly, the photoresist layer is located on top of the top surface of the ball limiting metallurgy layer, defines a first pocket located over the first thick pad, and defines a first upstanding wall which defines the first pocket. In the first stage sub-assembly, the pre-reflow solder structure is located within the first pocket and over a portion of a footprint of the first thick pad. In the first stage sub-assembly, an entirety of the first upstanding wall extends upwards from a first region of the top layer of the ball limiting metallurgy layer. In the first stage sub-assembly, no portion of the first region of the top layer of the ball limiting metallurgy layer is located on any downward-inclined discontinuity. A thickness of the first thick pad is substantially greater than 1 micrometer.

DETAILED DESCRIPTION

Generally speaking, at least some of the various embodiments of the present disclosure involve "thick pad dies" (see definition, below) that, during manufacture, avoid locating an upstanding edge of a photoresist layer (for example, the edge of a dry film photoresist layer) on top of a "discontinuity" (see definition, below). At least some of these embodiments avoid a problem recognized by the present invention, where solder flows into the mechanical interface between the photoresist layer and the layer under the photoresist layer in the vicinity of an upstanding edge of the photoresist layer (herein called "solder leakage"). While this solder leakage is not a problem in non-thick-pad dies, the present invention recognizes that it is a potential problem in thick pad dies because of the discontinuities that can be caused by the thick pads. Some embodiments of the present invention: (i) provide various ways of dealing with solder leakage in thick pad dies; and/or (ii) avoid oblong ball shapes associated with the solder leakage problem recognized by the present invention.

Ball limiting metallurgy (BLM) is used in semiconductor die, or chip, production to: (i) limit the flow of the solder ball to the desired area; (ii) provide adhesion (that is, mechanical connection, see definition of "mechanical connection," below) to the chip wiring; and (iii) provide contact (that is, electrical connection, see definition of "electrical connection," below) to the chip wiring. During semiconductor die fabrication, a BLM layer is applied to the die, and, then, a photoresist layer is then applied on top of the BLM layer. The photoresist may be in the form of a dry film. The photoresist is developed, exposed and selectively removed in the exposed areas to create "pockets" for solder placement. These pockets are typically cylindrical in shape, and have a central axis aligned with the desired central axis of the solder ball which the finished product will have. After the solder is placed into the pockets of the in-process die, the photoresist defining the pockets is removed from the sub-assembly.

When the photoresist is removed, the BLM layer that was underlying the photoresist layer is exposed and can be removed in further process steps. On the other hand, the portion of the BLM layer directly under the solder remains and will herein be called the "remaining BLM layer." The footprint of the remaining BLM layer: (i) controls and limits the size and shape of the base of the solder ball that is shaped during solder reflow; and (ii) thereby effectively controls the three dimensional geometry of the solder ball overlying the remaining BLM layer. Typically during reflow, a cylindrical solder formation defined by the pocket in the photoresist will be reshaped into a generally spherical structure. However, the present invention recognizes that solder leakage in thick line dies can cause solder leakage, which, in turn, causes the remaining BLM layer to take on an irregular shape in the vicinity of the solder leakage, which, in turn, causes the solder ball to take on an irregular shape during solder reflow. For example, if a spherical solder ball is desired, solder leakage causes: (i) the remaining BLM layer to have a non-circular footprint; (ii) the base of the solder ball to have a non-circular shape during solder reflow; and (iii) the solder ball to be shaped by reflow to be oblong in its geometry instead of spherical. This is a potentially serious problem recognized and solved by some embodiments of the present invention. Some specific embodiments that can potentially help avoid solder leakage problems and oblong solder ball problems will now be discussed below in connection with FIGS. 1-5.

Figure 1A:
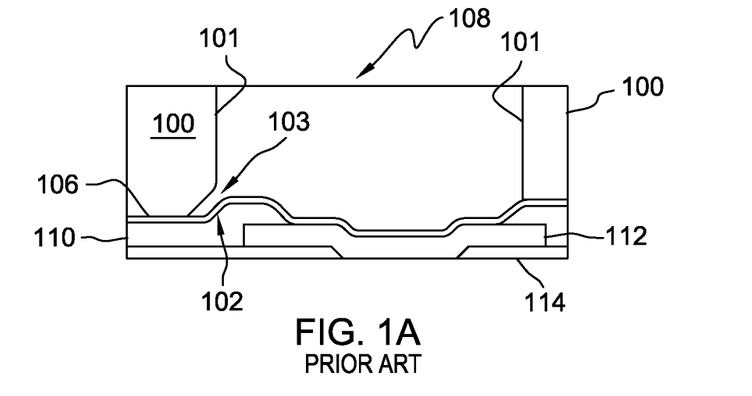
FIG. 1A is a cross-sectional (cross-hatching omitted for clarity of illustration purposes in all cross-sectional views herein) view illustrating a first in-process structure of a prior art semiconductor die contact.
Figure 1B:
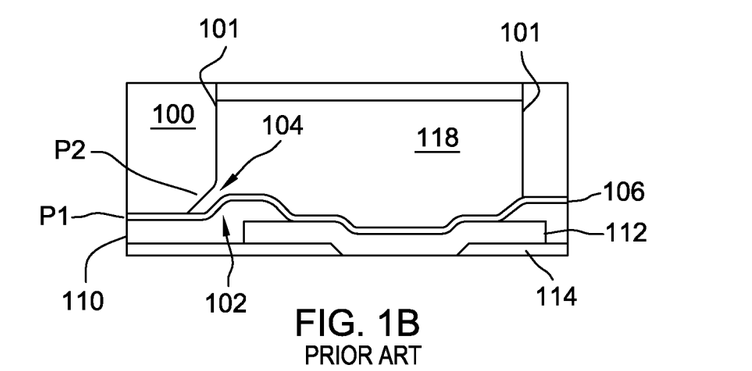
FIG. 1B is a cross-sectional view illustrating a second in-process structure of the prior art contact of FIG. 1A.
Figure 1C:
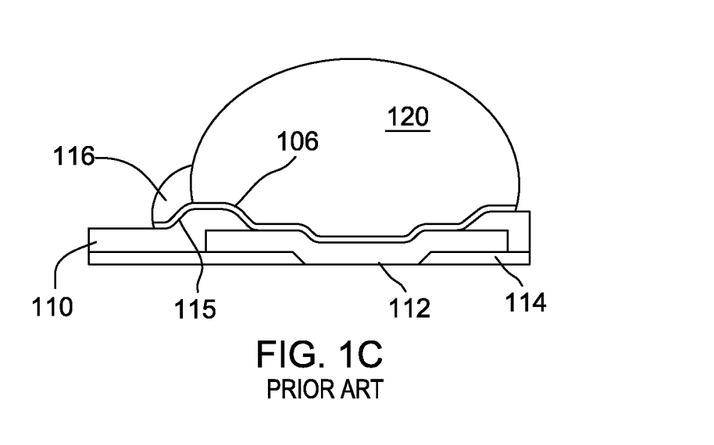
FIG. 1C is a cross-sectional view illustrating the structure of the prior art contact of FIGS. 1A and 1B contact.

FIGS. 1A, 1B and 1C respectively show a die contact sub-assembly at a first, second and third stage of manufacture. These FIGS. 1A, 1B and 1C demonstrate the solder leakage problem recognized and solved by some embodiments of the present invention as discussed above. The sub-assembly of FIGS. 1A, 1B and 1C collectively include: dry film photoresist 100 (including upstanding wall 101); downward-inclined discontinuity 102; BLM layer 106; pocket (also called solder cavity) 108; organic polymer final passivation layer (also called stress buffer layer) 110; thick last metal lines and pad 112; insulator layer 114; BLM layer irregularity 115; solder ball irregularity 116; solder pre-reflow structure 118; and solder ball structure 120.

Downward-inclined discontinuity 102 is caused by the fact that the thick metal pad 112 is a thick line style pad (see definitions of thick line die and downward-inclined discontinuity, below). More specifically, in this particular prior art contact sub-assembly, the organic polymer final passivation layer and the BLM layer overlying the passivation layer have a downward sloping discontinuity 102 in their top surfaces due to the thickness of pad 112. To describe the relevant geometry of FIG. 1B colloquially, the thick pad "pushes up" the top surface of the passivation layer and the overlying BLM layer to a higher plane P2 in the vicinity of the edge of the pad. The downward-inclined discontinuity 102 is located between higher plane P2 and the plane P1 of the die, which is located away from the vicinity of the thick pads.

As best shown in FIG. 1B, a portion of upstanding wall 101 is located over downward-inclined discontinuity 102. This downward-inclined discontinuity causes gap 103 (see FIG. 1A) between the top surface of the BLM layer and the bottom surface of the photoresist layer. This gap is caused by insufficient adhesion of a photoresist layer in the vicinity of any discontinuity. As stated in the definition of "discontinuity," below, when the non-horizontal portion of a top surface has geometry such that the photoresist used to form the pocket will not reliably adhere to the non-horizontal surface potion, then that non-horizontal surface portion can properly be considered a "discontinuity" as that term is used herein. As shown in FIG. 1B, solder flows into this gap, which causes: (i) BLM foot print irregularity 115 (see FIG. 1C) when the photo resist layer is removed; and (ii) solder ball irregularity 116 (see FIG. 1C) after solder reflow reshapes the solder from solder pre-reflow structure 118 to solder ball 120 (see FIG. 1C).

The final passivation layer, or stress buffer layer, behaves such that its contour reflects the underlying thick metal layer. Example of a stress buffer layer include: (i) photosensitive polyimide (PSPI); (ii) polybenzoxazole (PBO); and (iii) bis-benzocyclotene (BCB), but most spun-on films behave in a similar way. As a spun-on film, the contour does not exactly match the underlying structures, but the contour closely matches those structures. The resulting discontinuity in the above example has been observed as a 3 µm step, or slope.

Oblong C4 (controlled collapse chip connection) contact geometry is a condition that causes yield fallout in downstream operations, such as visual inspection or chip join. Oblong, or otherwise deformed, C4 contacts are often observed for the first time at final visual inspection of customer shippable hardware because it is observed during robotic vision system inspection, which is typically performed at the final inspection step. Significant yield loss (such as 60% to 80%) is possible if the C4 contact, or solder ball, geometry is not correct.

It has been observed that solder 118 seeps into gap 104 under the edge of dry film photoresist 100 due to insufficient adhesion of the edge of the resist to discontinuities in chip topography. The solder that seeps into the gap acts as a mask for BLM 106. The portion of the BLM masked by the solder cannot be removed in the process that removes other portions of the BLM. During reflow, the solder forms protrusion 116 on solder ball 120 at the location where the BLM is not removed, forming an undesirable solder ball geometry, such as an oblong shape.

Some embodiments of the present invention address the problem of downward-inclined discontinuities potentially caused by thick pad dies by: (i) removing the downward-inclined discontinuity; (ii) moving the downward-inclined discontinuity to a location on the chip footprint where it no longer underlies any portion of the pocket-defining upstanding wall in the photoresist layer; and/or (iii) moving the upstanding wall to a location on the chip footprint where it no longer overlies any portion of the downward-inclined discontinuity. Four embodiments of the present disclosure, which address the problem of downward-inclined discontinuities in thick pad dies, are described below.

Figure 2A:
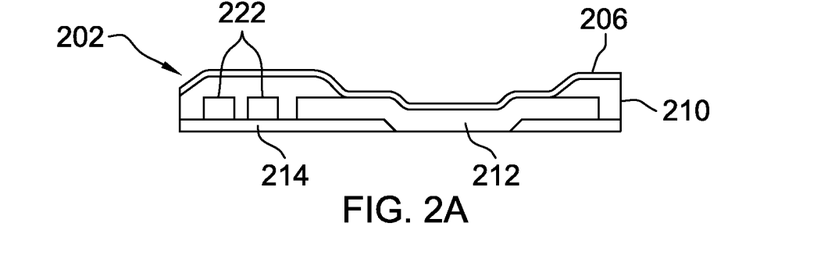
FIG. 2A is a cross-sectional view illustrating a first in-process structure of a first embodiment of a semiconductor die contact according to the present invention.
Figure 2B:
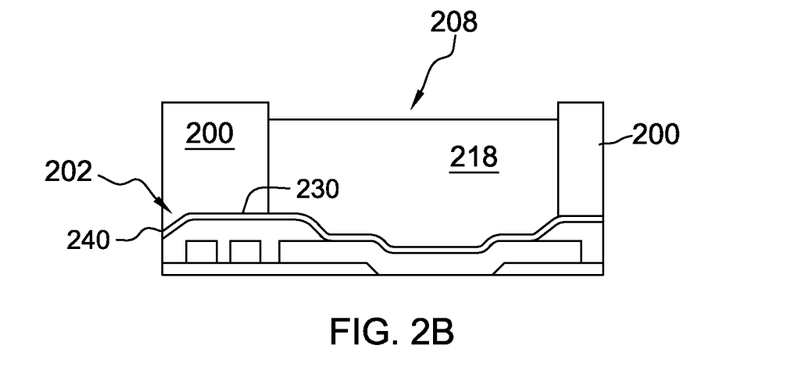
FIG. 2B is a cross-sectional view illustrating a second in-process structure of the first embodiment contact.
Figure 2C:
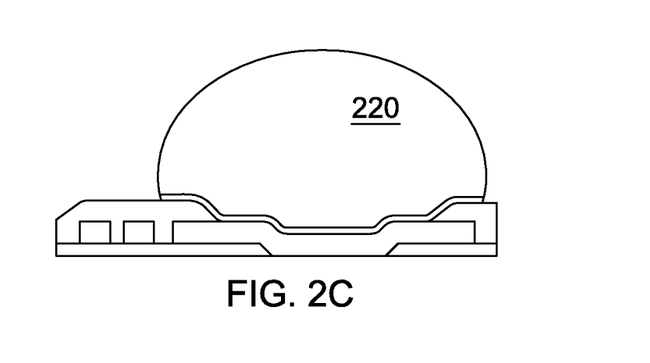
FIG. 2C is a cross-sectional view illustrating a third in-process structure of the first embodiment contact.

FIGS. 2A, 2B, and 2C are schematic views illustrating, in cross-section form, various in-process structures of a semiconductor die topography that resists solder ball deformation as discussed above. The figures include: dry film photoresist 200; downward-inclined discontinuity 202; BLM 206; solder cavity 208; organic polymer final passivation 210; thick metal pad 212; insulator 214; solder 218; solder ball 220; fill shape 222; elevated region 230; and non-elevated region 240.

As illustrated in FIGS. 2A, 2B, and 2C, fill shapes 222, or "dummy shapes," are added to the chip topography prior to applying stress buffer layer 210. By adding the dummy shapes, downward-inclined discontinuity 202 is located a sufficient distance away from solder cavity 208 so that the edge of photoresist 200 does not fall onto the downward-inclined discontinuity.

FIGS. 3A, 3B, 3C, and 3D are schematic views illustrating, in cross-section form, various in-process structures of a semiconductor die topography that resists solder ball deformation as discussed above. The figures include: dry film photoresist 300; BLM 306; solder cavity 308; organic polymer final passivation 310; thick metal pad 312; insulator 314; solder 318; solder ball 320; and dielectric 324.

Figure 3A:
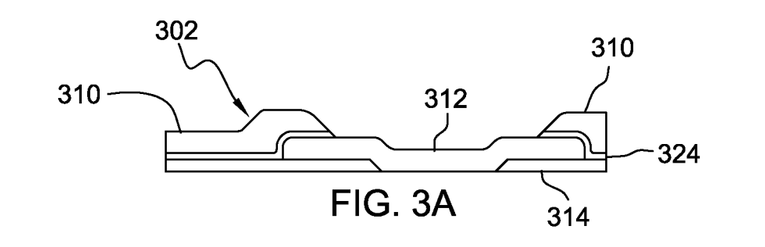
FIG. 3A is a cross-sectional view illustrating a first in-process structure of a second embodiment of a semiconductor die contact.
Figure 3B:
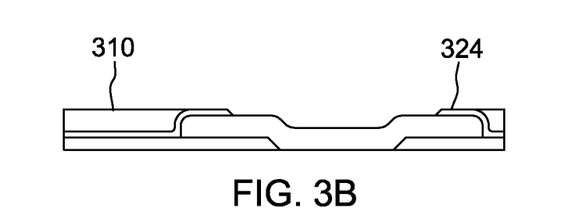
FIG. 3B is a cross-sectional view illustrating a second in-process structure of the second embodiment contact.
Figure 3C:
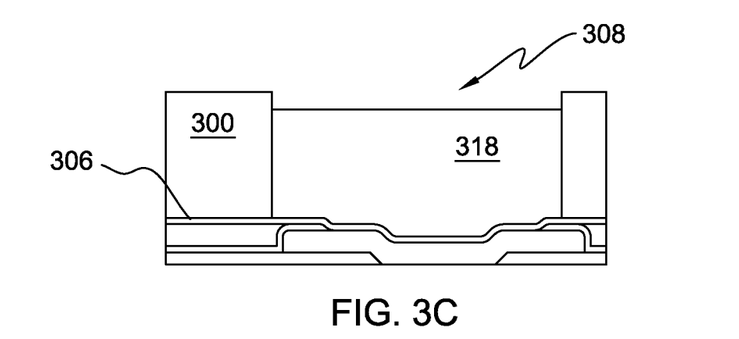
FIG. 3C is a cross-sectional view illustrating a third in-process structure of the second embodiment contact.
Figure 3D:
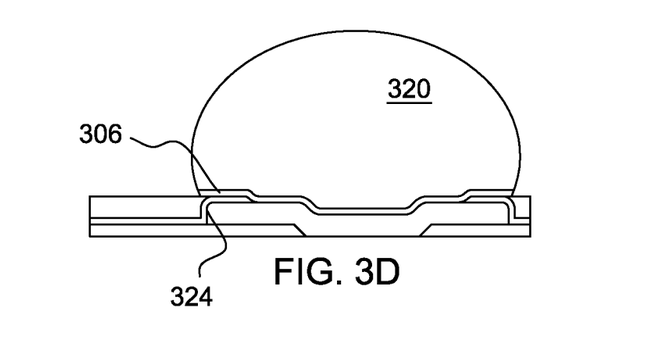
FIG. 3D is a cross-sectional view illustrating a fourth in-process structure of the second embodiment contact.

The process of using CMP to planarize passivation 310 is applied to the chip contour shown in FIG. 3A to produce the chip contour shown in FIG. 3A. By polishing the passivation surface to remove the discontinuity 302, the subsequent application of dry film photoresist 300, shown in FIG. 3C, is applied without creating a gap between the photoresist and the BLM that may lead to a misshaped solder ball. Alternatively, polishing the passivation surface reduces the size of the discontinuity, so that it is no longer considered a discontinuity as the term is used herein.

FIGS. 4A, 4B, 4C, and 4D are schematic views illustrating, in cross-section form, various in-process structures of a semiconductor die topography that resists solder ball deformation as discussed above. The figures include: dry film photoresist 400; discontinuity 402; BLM 406; solder cavity 408; organic polymer final passivation 410; thick metal pad 412; insulator 414; solder 418; solder ball 420; dielectric 424, and light 426.

Figure 4A:
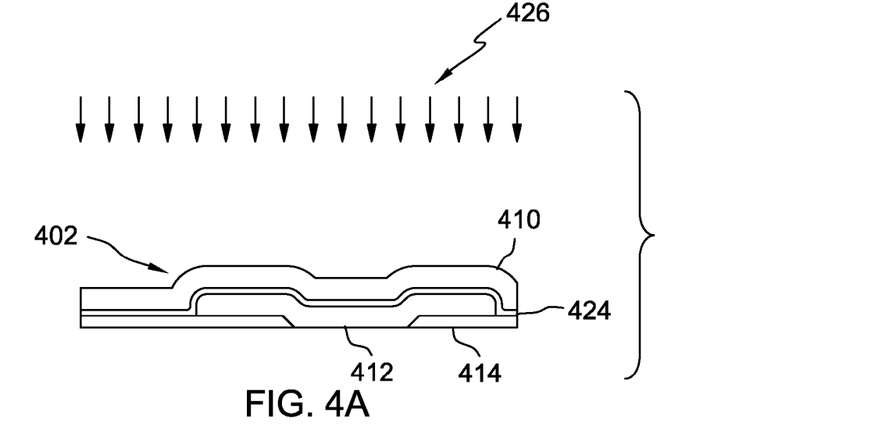
FIG. 4A is a cross-sectional view illustrating a first in-process structure of a third embodiment of a semiconductor die contact according to the present invention.
Figure 4B:
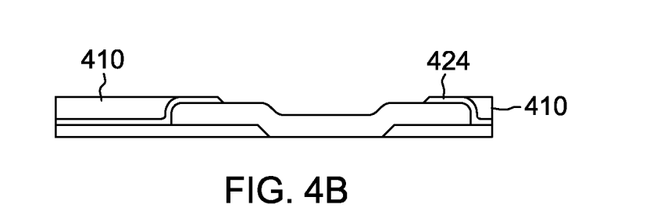
FIG. 4B is a cross-sectional view illustrating a second in-process structure of the third embodiment contact.
Figure 4C:
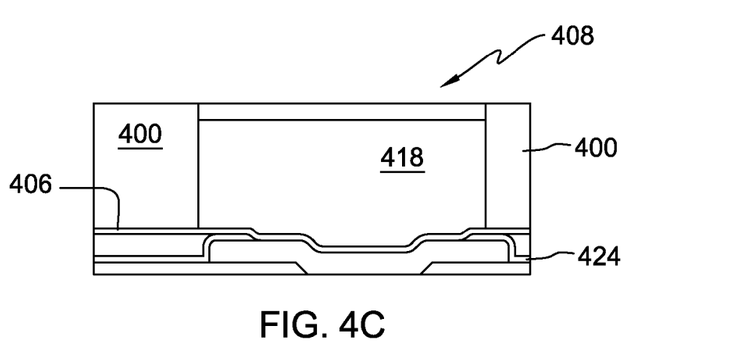
FIG. 4C is a cross-sectional view illustrating a third in-process structure of the third embodiment contact.
Figure 4D:
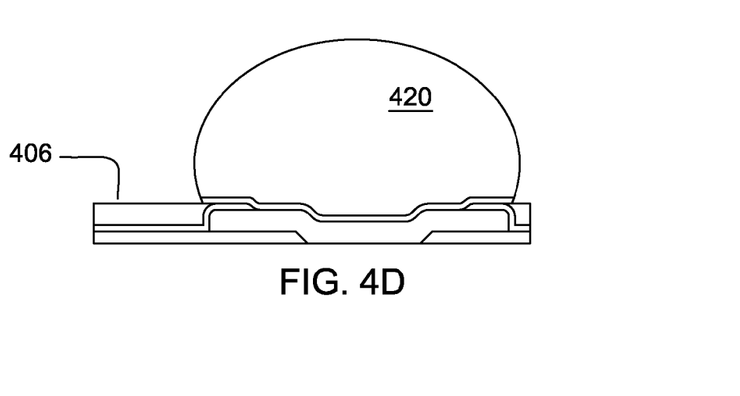
FIG. 4D is a cross-sectional view illustrating a fourth in-process structure of the third embodiment contact.

A halftone mask, or greytone mask, provides for light 426 to be applied in a controlled manner to passivation layer 410 to control the resulting contour. As shown in FIG. 4B, the light removes discontinuity 402. Alternatively, the light reduces the size of the discontinuity, so that it no longer qualifies as a discontinuity as the term is used herein. By adding a third color during photolithography as shown in FIGS. 4A and 4B, there is no need for the CMP step shown in FIGS. 3A and 3B, where the passivation layer is planarized.

FIGS. 5A, 5B, 5C, 5D, 5E, and 5F are schematic views illustrating, in cross-section form, various in-process structures of a semiconductor die topography that resists solder ball deformation as discussed above. The figures include: dry film photoresist 500a and 500b; discontinuity 502; BLM 506; solder cavity 508; organic polymer final passivation 510; thick metal pad 512; insulator 514; solder 518; solder ball 520; dielectric 524; and groove 528.

Figure 5A:
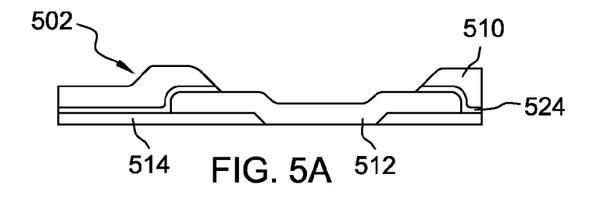
FIG. 5A is a cross-sectional view illustrating a first in-process structure of a fourth embodiment of a semiconductor die contact according to the present invention.
Figure 5B:
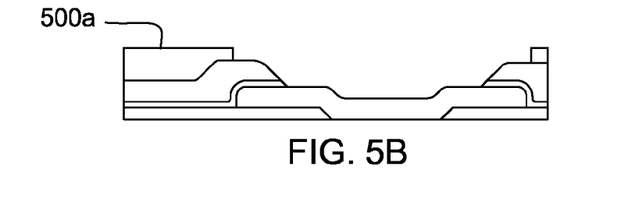
FIG. 5B is a cross-sectional view illustrating a second in-process structure of the fourth embodiment contact.
Figure 5C:
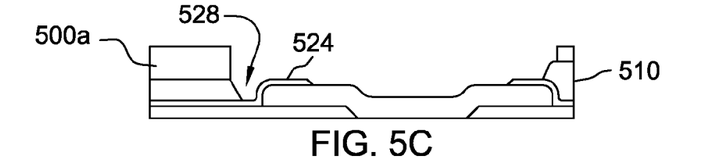
FIG. 5C is a cross-sectional view illustrating a third in-process structure of the fourth embodiment contact.

FIGS. 5A, 5B, 5C, 5D, 5E, and 5F present a two-part process to create desirable chip topography. The first part of the process is an etch-back process applied to passivation 510. FIG. 5A shows an in-process chip topography including discontinuity 502. Prior to applying BLM 506 (FIG. 5E) the discontinuity is removed by applying photoresist 500a to form groove 528, shown in FIG. 5C. This allows for the discontinuity to be controlled independently and moved to a location where it no longer qualifies as a discontinuity as the term is used herein.

Figure 5D:
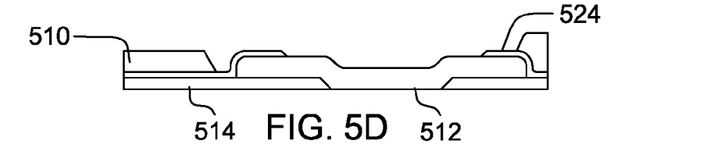
FIG. 5D is a cross-sectional view illustrating a fourth in-process structure of the fourth embodiment contact.
Figure 5E:
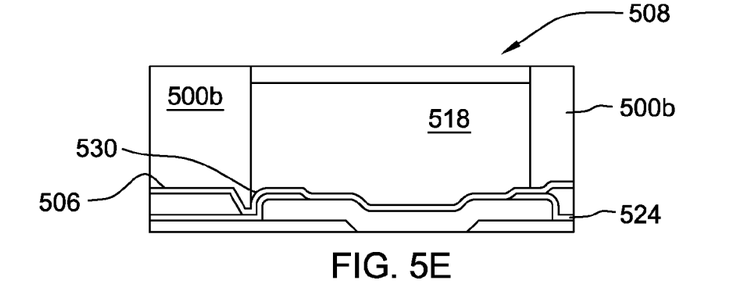
FIG. 5E is a cross-sectional view illustrating a fifth in-process structure of the fourth embodiment contact.
Figure 5F:
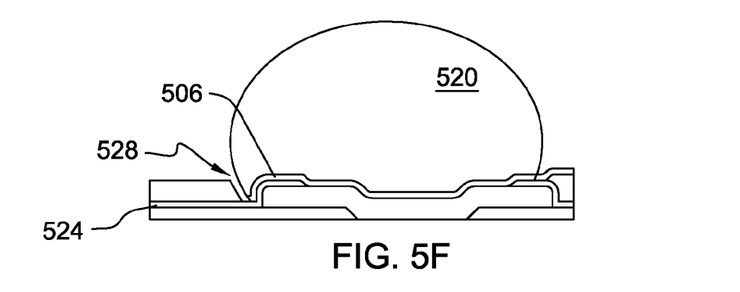
FIG. 5F is a cross-sectional view illustrating the structure of the fourth embodiment contact.

The second part of the process involves adding solder to cavity 508 and forming solder ball 520. As shown in FIG. 5E, photoresist 500b fills the groove, but does not extend beyond interior wall 530. In that way, BLM remains on the interior wall, but is removed from the bottom of the groove. FIG. 5F shows how the shape of the solder ball is controlled by the extent of the remaining BLM layer. Alternatively, photoresist 500b extends over interior wall 530 so that no portion of BLM 506 remains in groove 528 after processing.

The PSPI etch-back process shown in FIGS. 5A through 5D is a more costly method that others discussed herein. The increased cost is associated with an additional application of photoresist 500a in the process.

Note that, in FIG. 5D, the upstanding wall of photoresist that extends upward from interior wall 530 cannot be considered to extend upwards from a "discontinuity" because the definition of "discontinuity" (see below) does not exclude vertical portions of a top surface.

Some definitions of words or phrases used in this document will now be set forth in the following paragraphs.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: non-exclusive or; for example, A and/or B means that: (i) A is true and B is false; or (ii) A is false and B is true; or (iii) A and B are both true.

Discontinuity: a non-horizontal and non-vertical portion of the chip topography having sufficient: (i) angle; and/or (ii) height to potentially cause an adhesion problem due to an edge of the dry-film photoresist being unable to conform to the non-horizontal portion.

Downward-inclined discontinuity: any "discontinuity" that runs from a relatively high horizontal position to a relatively low horizontal position as one moves in a direction away from the central region of a pad.

Thick pad die: a semiconductor die with a last metallization layer thickness of substantially greater than 1 μm (micrometers); an example of the thick pads are found in some 200 mm (millimeter) wafers where the last metal pad is 4 μm thick compared to 1 μm, which is a common pad thickness.

Continuous topography: a topography that lies substantially in a single horizontal plane to at least an extent that there are no "discontinuities" (as that term is defined above) in a region of continuous topography; a top surface of a BLM layer may have more than one region of continuous topography as follows: (i) an elevated region of continuous topography overlying at least a portion of a footprint of a thick pad, and (ii) a non-elevated region away from the vicinity of the footprint of the thick pad.

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as mechanical connection that allows for relative motion between the mechanically connected components; includes, but is not limited to, welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

What is claimed is:

1. A method of making a semiconductor die contact assembly, the method comprising:
   providing a first stage assembly;
   removing a photoresist layer from the first stage assembly to yield a second stage assembly; and
   removing a portion of a ball limiting metallurgy layer from the second stage assembly to yield a third stage assembly;
   wherein:
   the first stage assembly includes the ball limiting metallurgy layer, a first thick pad, the photoresist layer, and a first pre-reflow solder structure;
   in the first and second stage assemblies, the ball limiting metallurgy layer defines a top surface;
   in the first stage assembly, the photoresist layer: (i) is located on top of the top surface of the ball limiting metallurgy layer, (ii) defines a first pocket located over the first thick pad, and (iii) defines a first upstanding wall defining the first pocket;
   in the first stage assembly, the pre-reflow solder structure is located within the first pocket and over a portion of a footprint of the first thick pad;
   in the first stage assembly, an entirety of the first upstanding wall extends upwards from a first region of the top surface of the ball limiting metallurgy layer;
   in the first stage assembly, no portion of the first region of the top surface of the ball limiting metallurgy layer is located on any downward-inclined discontinuity; and
   a thickness of the first thick pad is substantially greater than 1 micrometer.

2. The method of claim 1 further comprising:
   performing solder reflow on the third stage assembly to yield a fourth stage assembly;
   wherein:
   the solder reflow causes the first pre-reflow solder structure to be reshaped into a solder ball shape.

3. The method of claim 1 wherein:
   in the first stage assembly, the top surface of the ball limiting metallurgy layer includes: (i) a first elevated region located over at least the portion of the footprint of the first thick pad, (ii) a first non-elevated region located away from a vicinity of the footprint of the first thick pad, and (iii) a downward-inclined discontinuity region located between the first elevated region and the first non-elevated region.

4. The method of claim 3 wherein:
   the first region of the top surface of the ball limiting metallurgy layer is entirely located within the first elevated region.

5. The method of claim 1 wherein:
   the thickness of the first thick pad is at least approximately 4 micrometers.

6. A method of making a semiconductor die contact assembly, the method comprising:
   providing a first stage assembly;
   removing, from the first stage assembly, an uppermost portion of a passivation layer from a removed passivation layer footprint to yield a second stage assembly;
   depositing a ball limiting metallurgy layer over a top surface of the second stage assembly to yield a third stage assembly;
   depositing a photoresist layer and a first pre-reflow solder structure over a top surface of the third stage assembly to yield a fourth stage assembly;
   removing the photoresist layer from the fourth stage assembly to yield a fifth stage assembly; and
   removing a portion of the ball limiting metallurgy layer from the fifth stage assembly to yield a sixth stage assembly;
   wherein:
   the fourth stage assembly includes a portion of the passivation layer, the ball limiting metallurgy layer, a first thick pad, the photoresist layer, and the first pre-reflow solder structure;
   in the fourth stage assembly, the photoresist layer: (i) is located on top of a top surface of the ball limiting metallurgy layer, (ii) defines a first pocket located over the first thick pad, and (iii) defines an first upstanding wall defining the first pocket;
   in the fourth stage assembly, the first pre-reflow solder structure is located within the first pocket and over a portion of a footprint of the first thick pad;
   in the fourth stage assembly, an entirety of the first upstanding wall extends upwards from the removed passivation layer footprint; and
   a thickness of the first thick pad is substantially greater than 1 micrometer.

7. The method of claim 6 further comprising:
   performing solder reflow on the sixth stage assembly to yield a seventh stage assembly;
   wherein:
   the solder reflow causes the first pre-reflow solder structure to be reshaped into a solder ball shape.

8. The method of claim 6 wherein the removing of the uppermost portion of the passivation layer is achieved, at least in part, by chemical-mechanical polishing.

9. The method of claim 6 wherein the removing of the uppermost portion of the passivation layer further removes, an entirety of the passivation layer that is located within the removed passivation layer footprint.

10. The method of claim 9 wherein the removal of the entirety of the passivation layer that is located within the passivation layer footprint includes:
    selectively covering a top surface of a portion of passivation layer of the first stage assembly that is outside of the removed passivation layer footprint with a resist layer;
    removing the entirety of the passivation layer where the top surface of the passivation layer is not covered by the resist layer; and
    removing the resist layer from the top surface of a remaining portion of the passivation layer.

11. The method of claim 6 wherein:
    the first thick pad has a thickness substantially equal to 4 micrometers.

* * * * *